United States Patent
Treusch et al.

(10) Patent No.: US 6,895,027 B2
(45) Date of Patent: May 17, 2005

(54) CTE COMPENSATION OF SEMICONDUCTOR LASER BARS

(75) Inventors: Hans-Georg Treusch, Tucson, AZ (US); Guido Bonati, Weimar (DE)

(73) Assignee: Spectra-Physics, Tucson, AZ (US)

( * ) Notice: Subject to any disclaimer, the term of this patent is extended or adjusted under 35 U.S.C. 154(b) by 434 days.

(21) Appl. No.: 10/059,487

(22) Filed: Jan. 29, 2002

(65) Prior Publication Data

US 2003/0142711 A1 Jul. 31, 2003

(51) Int. Cl.[7] .............................. H01S 3/04; H01S 5/00; H01S 3/00
(52) U.S. Cl. .............................. 372/36; 372/34; 372/43; 372/45; 372/50; 372/109
(58) Field of Search .............................. 372/34, 36, 45, 372/50, 43, 109, 35, 33; 257/700

(56) References Cited

U.S. PATENT DOCUMENTS

| | | | |
|---|---|---|---|
| 5,751,552 A | 5/1998 | Scanlan | 361/707 |
| 5,812,570 A | 9/1998 | Spaeth | 372/36 |
| 5,848,083 A * | 12/1998 | Haden et al. | 372/36 |
| 6,268,653 B1 | 7/2001 | Wilson | 257/700 |
| 6,272,159 B1 | 8/2001 | Garcia | 372/36 |
| 6,535,533 B2 * | 3/2003 | Lorenzen et al. | 372/34 |
| 6,636,538 B1 * | 10/2003 | Stephens | 372/36 |

* cited by examiner

*Primary Examiner*—Don Wong
*Assistant Examiner*—Armando Rodriguez
(74) *Attorney, Agent, or Firm*—Howard R. Popper

(57) ABSTRACT

A laser bar is soldered to a conventional microchannel copper heat sink whose coefficient of thermal expansion (CTE) is locally modified in the area where the laser bar is soldered to better match the CTE of the laser bar. A strip of ceramic material having a CTE lower than that each of the laser bar and of the copper heat sink is soldered to portions of the metallic heat sink located adjacently to the surface area on which the laser bar is located. The inclusion of the ceramic strips enables a laser bar having a nominal CTE of $6.6 \times 10^{-6}/K$, to be soldered directly to a copper heat sink having a nominal CTE of $16.5 \times 10^{-6}/K$ without incurring thermal distortions at the interface that would limit the useful life of the laser bar.

2 Claims, 3 Drawing Sheets

CTE COMPENSATION OF SEMICONDUCTOR LASER BARS

FIELD OF THE INVENTION

This invention relates to high power laser bars and, more particularly, to extending their useful life.

BACKGROUND OF THE PRIOR ART

High power laser diode bars are commercially available in a variety of configurations including vertical and horizontal stacks such as shown in U.S. Pat. No. 6,272,159. Because the heat generated in a laser bar must be effectively dissipated, it is important that the thermal resistance at the laser bar's interface with the heat sink be low and that an efficient heat sink, such as a microchannel heat sink, constructed of thin copper plates between which water is pumped, be used. A micro-channel heat sink is shown in U.S. Pat. No. 6,268,653. In addition to low thermal resistance at the interface it is important that the materials as the interface have closely related coefficients of thermal expansion to avoid the influence of stress in thermal cycling. The '653 patent suggested that thermal stress from high temperature soldering can be alleviated if the heat sink were composed of a copper-beryllium oxide ceramic-copper sandwich instead of a single material. The laser bar is, in effect, soldered to copper "islands" on one side of a high thermal conductivity ceramic (beryllium oxide, synthetic diamond, or aluminum nitride) which had a coefficient of thermal expansion (CTE) nearer to that of the laser bar. U.S. Pat. No. 5,751,552 discusses the problem of substrate warpage which arises from differences in CTE between the copper strips to which laser components are soldered and the CTE of the ceramic substrate. Warpage of the substrate reduces the surface area available for heat transfer. The '552 patent proposed that conductive material be cast on the back surface of the ceramic substrate to counteract such warpage. Despite such approaches, premature failures still occur at high power outputs, especially in laser bars subjected to pulsed operation where alternate heating and cooling can shorten the useful life (generally defined as a 20% reduction in useful output power) from 10,000 hours to only 1000 hours. It would be extremely advantageous to be able to directly solder a laser bar to the copper surface of a conventional microchannel heat sink without inducing destructive thermal stresses and without requiring a special substrate.

SUMMARY OF THE INVENTION

In accordance with the principles of the invention, in one illustrative embodiment, the CTE of a conventional microchannel copper heat sink is locally modified in the area where the laser bar is soldered. A strip of ceramic material having a CTE lower than that of the laser bar and the copper heat sink is soldered to portions of the metallic heat sink located adjacently to the surface area on which the laser bar is located. The inclusion of the ceramic strips enable a laser bar having a nominal CTE of $6.6 \times 10^{-6}$/K, to be soldered directly to a copper heat sink having a nominal CTE of $16.5 \times 10^{-6}$/K without incurring thermal distortions at the interface that limit the useful life of the laser bar.

BRIEF DESCRIPTION OF THE DRAWING

The foregoing and other objects and features of the present invention may become more apparent from a reading of the ensuing description, together with the drawing, in which.

DETAILED DESCRIPTION

Figure 1:
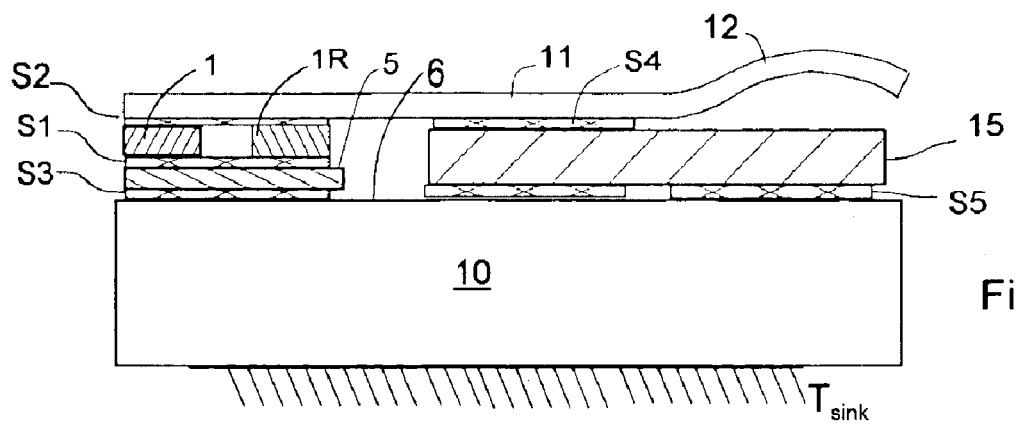
FIG. 1 shows a conventional attachment of a laser bar to a heat sink requiring the use of submount whose CTE matches that of the laser bar.

Referring to FIG. 1 the prior art method of mounting a laser bar 1 to a heat sink 10, such as that shown in U.S. Pat. No. 6,272,159, requires the use of a ceramic submount 5 whose CTE matches that of the laser bar. The use of a submount 5 requires two solder joints S1 and S3 in addition to the solder joint between laser bar 1 and spring contact 11. Each of the solder joints will have a thickness that depends on the type of solder used and the materials being joined. Illustratively, joint S1 between laser bar 1 and ceramic substrate 5 is a $25\mu$ thick Au—Sn "preform" solder joint; joint S2 Between laser bar 1 and spring contact 11 is a $25\mu$ thick InAg solder joint; joint S3 between ceramic substrate 5 and heat sink 10 is a $37\mu$ thick In solder preform joint. A surge protecting reverse diode 1R, as described in U.S. Pat. No. 6,028,878 assigned to the assignee of the present invention, may also be soldered in tandem with laser bar 1. Electrical contact to laser diode bar 1 is provided by spring member 11 which has an arcuate portion 12 to make contact with an electrical power source (not shown). Because the top surface of laser bar 1 affords only a minimal area for mounting spring member 11, it is customary to employ a ceramic standoff 15 to provide auxiliary support 15. This need for an auxiliary support 15, however, complicates the assembly process because the height above surface 6 of standoff 15 plus solder joints S4 and S5 should equal the height above surface 6 of laser bar 1 plus submount 5 plus solder joints S1, S2 and S3. Maintaining such equal height dimension requires tight tolerances on solder preforms S1 and S3, the height dimension of laser bar 1 and of submount 15 as well as solder joints S4, S5 and the standoff insulator 15

It thus would be desirable to simplify the assembly process by eliminating the need for submount 5. In the past, however, it has always been thought necessary to employ a submount because the CTE of the mounting surface 6 of heat sink 10 differs greatly from the CTE of laser bar 1. For example, laser bar 1 typically has a CTE of approximately $6.5 \cdot 10^{-6}$/° K while mounting surface 6 of heat sink 10, typically made of copper or a copper alloy, has a CTE of $16.5 \cdot 10^{-6}$/° K. This large mismatch in CTE can introduce thermal stress either during actual operation or during soldering, typically lasting 1–2 minutes, using In-based solder at 150° C. or AuSn solder at about 250° C. to 300° C. Usually such soldering is accomplished in a nitrogen atmosphere oven followed by an annealing interval of half a minute. In the prior art typified by what is shown in FIG. 1, the CTE mismatch is alleviated somewhat by the use of ceramic submount 5 whose CTE more closely matches that of laser bar 1. However it would nevertheless be desirable to permit the laser bar 1 to be directly soldered to surface 6 of heat sink 10.

Figure 2:
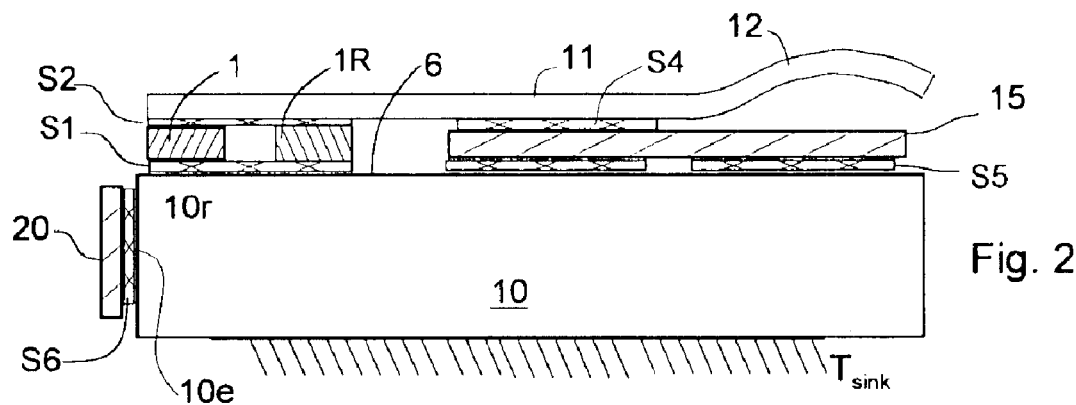
FIG. 2 shows the inventive method of CTE compensation which permits direct attachment of a laser bar assembly to a heat sink.

Referring now to FIG. 2, the inventive embodiment is shown which dispenses with the need for submount 5 and its attendant difficulties in maintaining close manufacturing tolerances. In accordance with the invention, the coefficient of thermal expansion of mounting surface 6 of heat sink 10 is locally modified in the region 10r beneath the surface where laser bar 1 is mounted. This is accomplished by soldering to a surface of heat sink 10 at least one strip or plate of CTE compensating ceramic 20 that has a lower CTE than that of both laser bar 1 and heat sink 10. Advantageously, one such CTE compensating ceramic strip 20 is attached to a surface of heat sink 10 other than the laser bar mounting surface 6. In addition, it is desirable to employ a ceramic standoff 15 on laser bar mounting surface 6 which has the same CTE as strip 20. The soldering of CTE compensating ceramic strip 20 to heat sink 10 at solder joint S6 eliminates the need for solder joint S3 required in FIG. 1 and thus can be accomplished without regard to maintaining close tolerances on four elements above surface 6. In addition, laser bar 1 can now be soldered directly to the mounting surface 6 of heat sink 10 with a much thinner solder joint S1 (FIG. 2) which advantageously may be only a 6$\mu$ thick evaporated indium layer rather than the typical 37$\mu$ thick indium preform solder joint S1 (FIG. 1).

Figure 3:
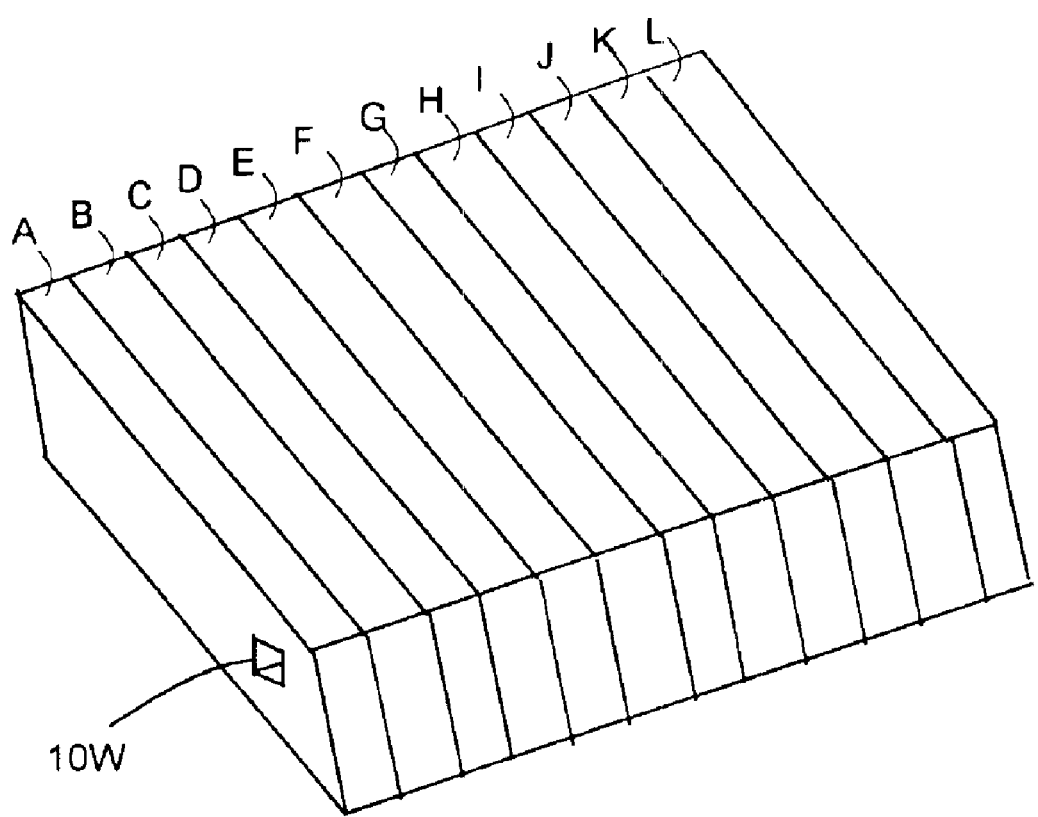
FIG. 3 shows the static displacement over the mounting surface of a heat sink subjected to temperature stress.
Figure 4:
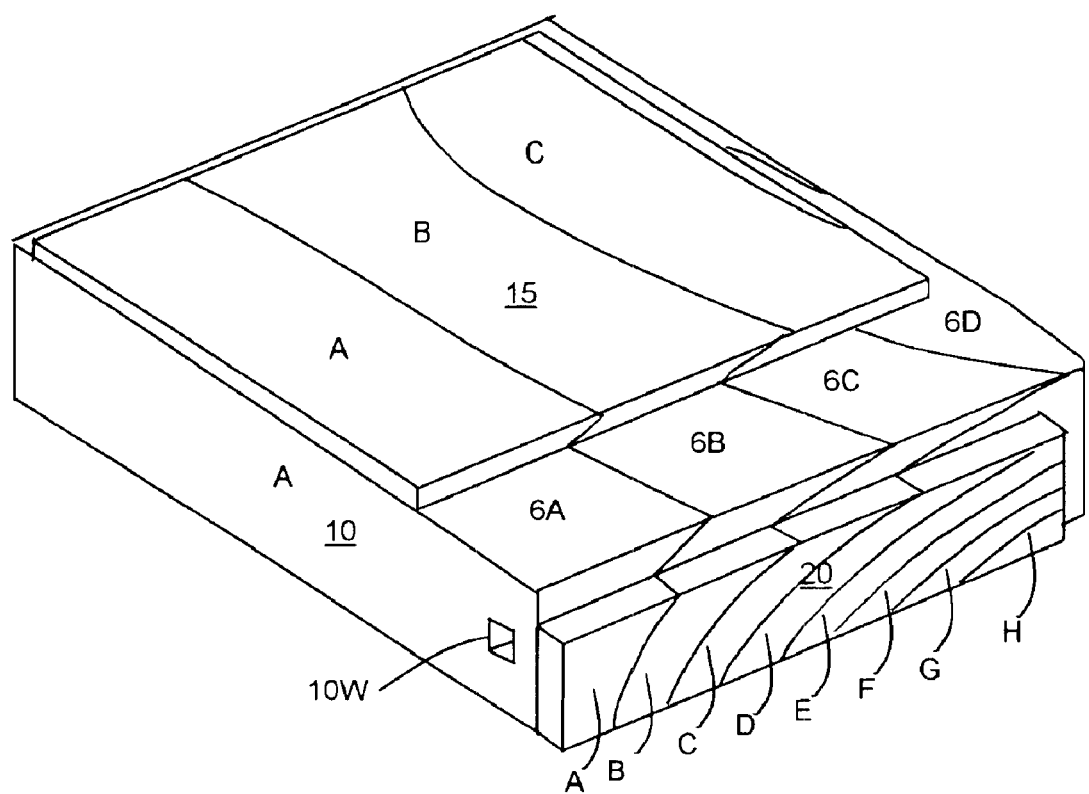
FIG. 4 shows the reduced static displacement of the heat sink mounting surface when compensated in accordance with the invention.

The effect of attaching ceramic strip 20 to heat sink 10 is shown in the contrasting static displacement drawings of FIGS. 3 and 4 which have been computed by a technique known as finite element analysis. These Figs. show the static displacements of surface areas of heat sink 10 when heat sink 10 is exposed to temperature excursions comparable to what would be experienced during high temperature soldering. FIG. 3 shows the static displacement of the mounting surface 6 of heat sink 10 when it alone is subject to the temperature excursions. FIG. 4 shows the static displacement of the mounting surface of heat sink 10 when it is augmented by the attachment of CTE compensating ceramic strip 20 and a standoff 15 having the same CTE as strip 20. In FIG. 3 the temperature excursion results in substantially uniform incremental expansion of the heat sink surface 6. This uniform incremental expansion is to be expected in an amount determined by the heat sink's thermal coefficient of expansion. This fully expected effect, however, has been found to be critical to inducing stress at the interface with solid state laser diode 1 which generally has a much different coefficient of thermal expansion. Table 1 relates to the lettered segments of FIGS. 3 and 4 and lists illustrative static displacements length in the "X" direction for 12 finite elements over a 5 mm length. As shown, the heat sink of FIG. 1 undergoes the complete range of static displacement from A to L.

| Element | "X" Displacemet (FIGS. 3 and 4) |
|---|---|
| A | 0.000e+000 |
| B | 2.083e−006 |
| C | 4.167e−006 |
| D | 6.250e−006 |
| E | 8.333e−006 |
| F | 1.042e−005 |
| G | 1.250e−005 |
| H | 1.458e−005 |
| I | 1.667e−005 |

-continued

| Element | "X" Displacemet (FIGS. 3 and 4) |
|---|---|
| J | 1.875e−005 |
| K | 2.083e−005 |
| L | 2.292e−005 |
| M | 2.500e−005 |

As can be seen in FIG. 4, the effect of adding the ceramic plate 20, advantageously having the same CTE as standoff 15, reduces the overall range of static displacement of surface mounting area 6 to which laser diode 1 would be soldered. The static displacement has been reduced so that it only undergoes a reduced range of displacements from A to C each of which covers a wider area than the comparable regions of FIG. 3. Thus, the displacement gradient is less over the soldering interface surface 6 between laser bar 1 and heat sink 10. The overall effect is therefore that of causing the interface surface 6 of heat sink 10 to locally match the coefficient of expansion of the semiconductor laser diode bar 1.

Figure 5:
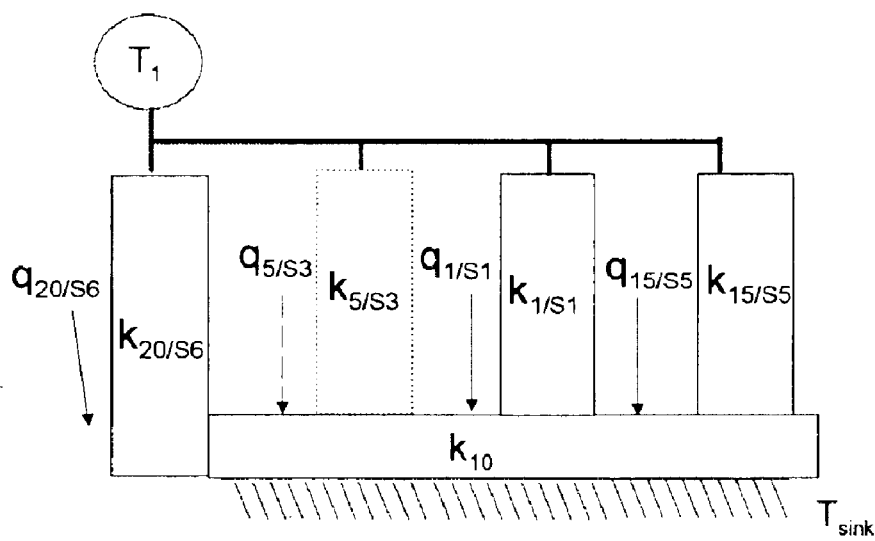
FIG. 5 is a simplified thermal heat flow diagram.

Referring now to FIG. 5 the simplified heat flow diagram shows the effect of replacing submount 5 with CTE compensating strip 20. The temperature $T_1$ of laser bar 1 causes heat to flow from laser bar 1 toward the lower temperature $T_{sink}$ of microchannel heat sink 10. Heat flow $q_{1/S1}$ follows the most direct path from laser bar 1 through solder joint S1 (which can be made much thinner and hence have a greater "k" value than the comparable solder joint of FIG. 1). In addition, heat can flow through QTE compensating strip 20 and solder joint S6 to heat sink 10 with the "k" of solder joint S6 (and its area of surface contact) chosen to maximize heat transfer.

What has been described is deemed to be illustrative of the principle of the invention. Further and other modifications will be apparent to those skilled in the art without, however, departing from the spirit and scope of the invention.

What is claimed is:

1. The method of alleviating thermal distortion at the interface between a laser bar and the mounting surface of a heat sink having different coefficients of thermal expansion by locally lowering the effective coefficient of thermal expansion of the heat sink's laser bar mounting surface to more closely match that of the laser diode bar, comprising:

a. mounting said laser bar to said mounting surface of said heat sink; and b. attaching to a surface of said heat sink immediately adjacent to an edge of said laser bar at least one ceramic plate having a coefficient of thermal expansion lower than that of each of said laser bar and said heat sink to locally modify the coefficient of thermal expansion of said heat sink mounting surface in the area thereof on which said laser bar is mounted.

2. The method of claim 1 wherein said heat sink is a microchannel heat sink.

* * * * *